United States Patent
Kang et al.

(10) Patent No.: US 11,145,365 B2
(45) Date of Patent: Oct. 12, 2021

(54) DATA SEARCH SYSTEMS AND METHODS

(71) Applicant: PEKING UNIVERSITY, Beijing (CN)

(72) Inventors: Jinfeng Kang, Beijing (CN); Peng Huang, Beijing (CN); Xiaoyan Liu, Beijing (CN); Lifeng Liu, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 814 days.

(21) Appl. No.: 15/778,160

(22) PCT Filed: Dec. 20, 2016

(86) PCT No.: PCT/CN2016/111011
§ 371 (c)(1),
(2) Date: May 22, 2018

(87) PCT Pub. No.: WO2018/112736
PCT Pub. Date: Jun. 28, 2018

(65) Prior Publication Data
US 2021/0225445 A1    Jul. 22, 2021

(51) Int. Cl.
*G11C 5/14* (2006.01)
*G11C 13/00* (2006.01)

(52) U.S. Cl.
CPC ...... *G11C 13/0038* (2013.01); *G11C 13/0069* (2013.01)

(58) Field of Classification Search
CPC .... G11C 13/0038; G11C 13/0069; G11C 5/14
(Continued)

(56) References Cited

U.S. PATENT DOCUMENTS

2014/0153314 A1* 6/2014 Baker ............... G06F 30/392
                                              365/148
2014/0369108 A1* 12/2014 Mohammad ........ G06F 30/392
                                              365/148
(Continued)

FOREIGN PATENT DOCUMENTS

CN       2864808       1/2007
CN       101610152     12/2009
(Continued)

OTHER PUBLICATIONS

First Chinese Office Action, issued in the corresponding Chinese patent application No. 201611190709.8, dated Sep. 27, 2019, 21 pages.
(Continued)

*Primary Examiner* — Harry W Byrne
(74) *Attorney, Agent, or Firm* — Hamre, Schumann, Mueller & Larson, P.C.

(57) ABSTRACT

The present disclosure provides a data search system and a data search method for determining whether there is stored information data matched with query information data in a storage circuit. The data search system comprises a storage circuit, a control circuit, and a feature extraction circuit, wherein the storage circuit comprises at least one storage unit which comprises a memristor crossbar array, a read/write unit, a decoder and a multiplexer, and the feature extraction circuit is configured to extract feature values of the query data. In the data search method, both the data matching process and the data storage process are performed in the memristor crossbar array under the control of the control circuit, which thus largely reduces the amount of data transmission while greatly improving the speed of data search using the characteristics of parallel calculation of the memristor crossbar array.

10 Claims, 5 Drawing Sheets

(58) Field of Classification Search
USPC ............ 365/185.01, 185.02, 185.03, 185.05,
365/185.06, 185.1, 185.11, 185.17,
365/185.21, 185.22, 189.09
See application file for complete search history.

(56) References Cited

U.S. PATENT DOCUMENTS

| | | | |
|---|---|---|---|
| 2015/0170025 A1* | 6/2015 | Wu ................... | G11C 13/0069 |
| | | | 706/25 |
| 2015/0347896 A1* | 12/2015 | Roy ...................... | G06N 3/063 |
| | | | 365/148 |

FOREIGN PATENT DOCUMENTS

| | | |
|---|---|---|
| CN | 102832343 | 12/2012 |
| CN | 103811058 | 5/2014 |
| CN | 104051009 | 9/2014 |
| CN | 105353995 | 2/2016 |
| CN | 106128503 | 11/2016 |
| KR | 20100048626 | 5/2010 |
| WO | 2016099472 | 6/2016 |

OTHER PUBLICATIONS

Zhu et al.,"Memristor: "Abacus Beads" for Integrating Big Data Computing and Storage", Communications of the CCF, Nov. 2014,7 pages (English abstract enclosed).
International Search Report and Written Opinion, issued in the corresponding PCT application No. PCT/CN2016/111011, dated Sep. 18, 2009, 10 pages.

* cited by examiner

DATA SEARCH SYSTEMS AND METHODS

TECHNICAL FIELD

The present disclosure relates to semiconductor integrated circuits, and more particularly, to a data search system and method.

BACKGROUND

With the rapid development of information technology, the amount of data in the current information processing has an explosive growth. There is currently a large amount of media data, such as texts, slideshows, images and sounds etc. on personal computers or storage media of a data center. How to find user-specified data becomes more and more difficult with the increase of the amount of data. How to efficiently and quickly find the user-specified data information so as to improve the working efficiency becomes very urgent.

The conventional computer search process is to transmit data stored in a storage medium to a processor and match the transmitted data with specified data. In the past 10 years, the performance of computer processors has been greatly improved, and in addition, data matching can also be accelerated using an acceleration chip such as a Field Programmable Gate Array (FGPA) etc. However, improvement of a speed of data transmission is developed slowly due to a bandwidth limitation. Therefore, the main bottleneck which currently restricts the data search lies in the data transmission. In recent years, the integration technology of calculation and storage based on a memristor crossbar array has been developed rapidly, and any logical operation can be performed on data stored in any position on the memristor crossbar array and a result of the operation can be stored in a specified position.

SUMMARY

In an aspect of the present disclosure, there is provided a data search system, comprising:

a storage circuit comprising at least one storage unit, wherein the storage unit comprises a memristor crossbar array for storing query information data and stored information data and matching the query information data with the stored information data; and a control circuit configured to generate a control signal for controlling the storage circuit to complete storing and matching of the query information data.

Preferably, the query information data comprises query data or feature values of the query data, and the stored information data comprises stored data or feature values of the stored data.

Preferably, the storage units are independent from each other for parallel calculation.

Preferably, the memristor crossbar array comprises at least one memristor unit which is a memristor, or a memristor and a bi-directional selector, or a memristor and a transistor.

Preferably, the storage unit further comprises:

a decoder configured to generate an address signal and an operation type signal according to the control signal generated by the control circuit, and output the address signal to a multiplexer and the operation type signal to a read/write unit;

the read/write unit configured to generate an operation signal according to the operation type signal and output the operation signal to the multiplexer, wherein the operation signal is a write signal, a read signal and a logical operation signal; output the query information data to the multiplexer; and return a result of an AND operation which is output by the memristor crossbar array to the multiplexer; and the multiplexer configured to output the operation signal to a corresponding port of the memristor crossbar array according to the address signal, and write the query information data to the memristor crossbar array.

Preferably, the data search system may further comprise a feature extraction circuit configured to extract the feature values of the query data.

In another aspect of the present disclosure, there is further provided a data search method for searching at least one memristor crossbar array in a storage circuit for stored information data matched with query information data, comprising:

S1: storing the query information data in a column in one of the at least one memristor crossbar array;

S2: performing an XOR operation on each bit of the query information data and each bit of the stored information data, and storing a result of the operation in at least one column memristors of the memristor crossbar array other than the column in which the query information data and the stored information data are located;

S3: performing an AND operation on each bit of the result of the XOR operation and storing a result of the AND operation into a memristor unit which is in the same column as that for storing the result of the operation and has no data stored thereon; and S4: repeating steps S1-S3 for other memristor crossbar arrays to obtain at least one result of the AND operation, and judging a data search result according to the result of the AND operation.

Preferably, there is at least one stored information data, a column where the stored information data is located is in at least one column other than the column where the query information data is located, and stored information data in different memristor crossbar arrays is not completely the same.

Preferably, in step S1, the query information data is stored in the memristor crossbar array in a form of inversion by bit.

Preferably, step S4 further comprises:

if at least one result of the AND operation is logical "1", stored information data matched with the query information data can be found by the storage circuit; and if all the results of the AND operation are logical "0", the stored information data matched with the query information data cannot be found by the storage circuit, wherein the number of results of the AND operation which are logical "1" is the number of the stored information data matched with the query information data.

Both the data matching process and the data storage process in the present disclosure are completed in the memristor crossbar array under the control of the controller, which thus largely reduces the amount of data transmission while greatly improving the speed of data search using the characteristics of parallel calculation of the memristor crossbar array.

DETAILED DESCRIPTION

Figure 1:
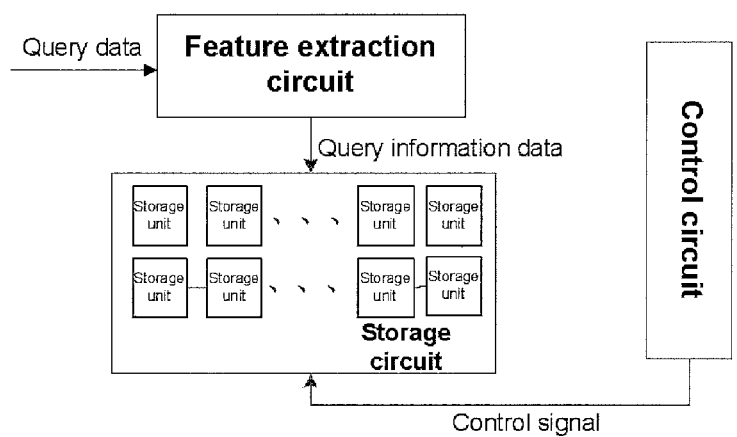
FIG. 1 schematically illustrates a data search system according to an embodiment of the present disclosure.

In the era of big data and under the background of rapid development of integration of storage and calculation of a memristor crossbar array, in order to improve the efficiency of data search, in an aspect according to the embodiments of the present disclosure, there is provided a data search system, comprising:

a storage circuit comprising at least one storage unit, wherein the storage unit comprises a memristor crossbar array for storing query information data and stored information data and matching the query information data with the stored information data, wherein the query information data comprises query data or feature values of the query data, and the stored information data comprises stored data or feature values of the stored data; and a control circuit configured to generate a control signal for controlling the storage circuit to complete storing and matching of the query information data.

Specifically, the data search system may further comprise a feature extraction circuit configured to extract the feature values of the query data.

Specifically, the storage units are independent from each other for parallel calculation.

The memristor crossbar array comprises at least one memristor unit which may be a memristor, or a memristor and a bi-directional selector, or a memristor and a transistor.

Specifically, the storage unit further comprises:

a decoder configured to generate an address signal and an operation type signal according to the control signal generated by the control circuit, and output the address signal to a multiplexer and the operation type signal to a read/write unit;

the read/write unit configured to generate an operation signal according to the operation type signal and output the operation signal to the multiplexer, wherein the operation signal is a write signal, a read signal and a logical operation signal; output the query information data to the multiplexer; and return a result of an AND operation which is output by the memristor crossbar array to the multiplexer; and the multiplexer configured to output the operation signal to a corresponding port of the memristor crossbar array according to the address signal, and write the query information data to the memristor crossbar array.

In another aspect according to the embodiments of the present disclosure, there is further provided a data search method for searching at least one memristor crossbar array in a storage circuit for stored information data matched with query information data, comprising:

S1: storing the query information data in a column of memristors in one of the at least one memristor crossbar array;

S2: performing a XOR operation on each bit of the query information data and each bit of the stored information data, and storing a result of the operation in at least one column of memristors of the crossbar array other than the column in which the query information data and the stored information data are located, wherein specifically, there is at least one stored information data, a column where the stored information data is located is in at least one column other than the column where the query information data is located, and stored information data in different memristor crossbar arrays is not completely the same;

S3: performing an AND operation on each bit of the result of the operation and storing a result of the AND operation in a memristor unit which is in the same column as that for storing the result of the operation and has no data stored thereon; and S4: repeating steps S1-S3 for other memristor crossbar arrays to obtain at least one result of the AND operation, and judging a data search result according to the result of the AND operation.

Step S4 further comprises:

if at least one result of the AND operation is logical "1", stored information data matched with the query information data can be found by the storage circuit; and if all the results of the AND operation are logical "0", the stored information data matched with the query information data cannot be found by the storage circuit, wherein the number of results of the AND operation which are logical "1" is the number of the stored information data matched with the query information data. In order to make the purposes, technical solutions, and advantages of the present disclosure more clear, the present disclosure will be further described in detail below with reference to the accompanying drawings in combination with specific embodiments.

It should be illustrated that, in the accompanying drawings or the description of the specification, the similar or same reference numbers are used for similar or same parts. Further, in the accompanying drawings, shapes or thicknesses in the embodiments may be exaggerated and are labeled in a simplified or convenient manner. Further, elements or implementations not shown or described in the accompanying drawings are well known to those of ordinary skill in the art. In addition, while the present disclosure can provide an example of a parameter which includes a particular value, it should be understood that the parameter needs not to be exactly equal to the corresponding value, but may approximate the corresponding value within an acceptable error margin or design constraint.

The preferred embodiment of the present disclosure will be given below on the basis of the above embodiments. It should be illustrated that the preferred embodiments are merely used for understanding of the present disclosure and are not intended to limit the protection scope of the present disclosure. Moreover, the features in the preferred embodiments are applicable to both method embodiments and apparatus embodiments unless otherwise specified, and the technical features appearing in the same or different embodiments can be used in combination without conflict.

FIG. 1 schematically illustrates a data search system according to an embodiment of the present disclosure. As shown in FIG. 1, the data search system comprises a storage circuit, a control circuit, and a feature extraction circuit. The storage circuit comprises at least one storage unit, wherein the storage unit comprises a memristor crossbar array for storing query information data and stored information data and matching the query information data with the stored information data; the control circuit generates a control signal for controlling the storage circuit to complete storing and matching of the query information data; and the feature extraction circuit is configured to extract feature values of the query data.

The feature extraction circuit obtains feature values of query data input from the outside by performing feature extraction on the query data. The query data or the feature values of the query data, i.e., the query information data, are stored in the memristor crossbar array in the storage circuit under the control of the control circuit. In the memristor crossbar array, the stored information data, i.e., the stored data or the feature values of the stored data, is searched for and is compared with the query information data, so as to judge whether there is stored information data matched with the query information data in the storage circuit. The number of data units in the storage system according to the present disclosure may be designed depending on practical requirements and manufacturing capabilities. As the data units in which calculation and storage are integrated are independent from each other, data search can be performed simultaneously to achieve a high level of parallelism, thereby increasing the speed and efficiency of the data search.

Figure 2:
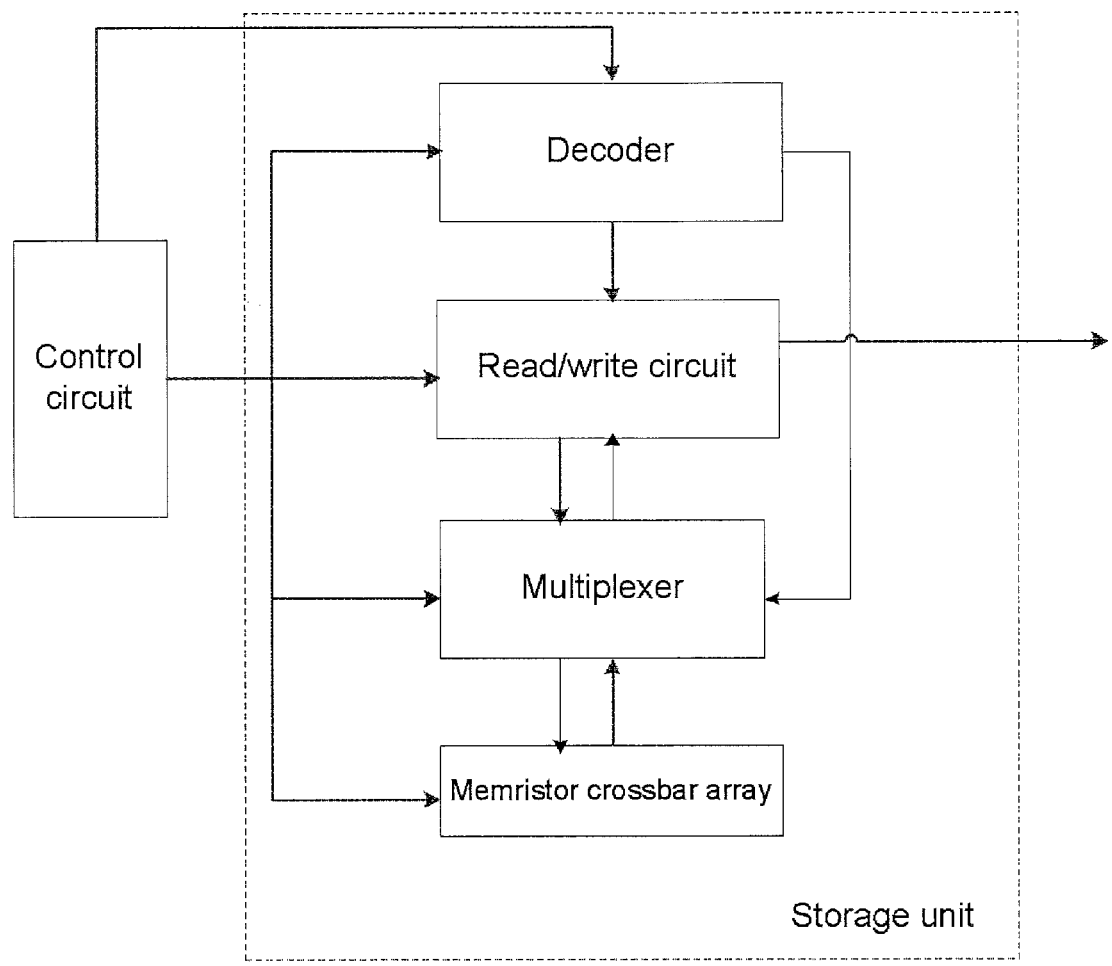
FIG. 2 schematically illustrates a composition structure of a storage unit according to an embodiment of the present disclosure.

FIG. 2 schematically illustrates a composition structure of a storage unit according to an embodiment of the present disclosure. As shown in FIG. 2, the storage unit comprises a memristor crossbar array, a read/write unit, a decoder and a multiplexer. The control circuit in the storage system outputs a control signal to the decoder. The decoder generates an address signal and an operation type signal according to the control signal, and outputs the address signal to the multiplexer and the operation type signal to the read/write unit. The read/write unit generates an operation signal according to the operation type signal and outputs the operation signal to the multiplexer, wherein the operation signal is a write signal, a read signal and a logical operation signal; outputs the query information data to the multiplexer; and returns a result of an AND operation which is output by the memristor crossbar array to the multiplexer. The multiplexer outputs the operation signal to a corresponding port of the memristor crossbar array according to the address signal, and writes the query information data to the memristor crossbar array.

At the same time, the control circuit generates a control signal and outputs the control signal to various composition structures in the storage unit, so as to realize control of the storage unit by the control circuit.

Figure 3:
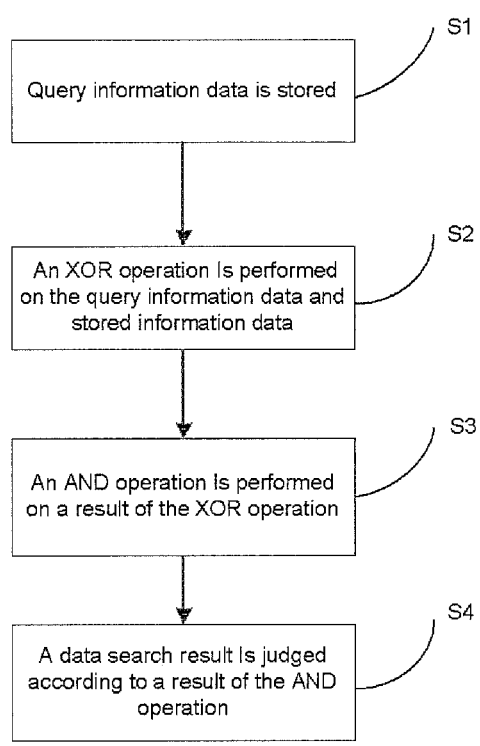
FIG. 3 schematically illustrates a data search method according to an embodiment of the present disclosure.

Based on the same inventive concept, the embodiments of the present disclosure further provide a data search method. FIG. 3 schematically illustrates a data search method according to an embodiment of the present disclosure. As shown in FIG. 3, the method comprises the following steps.

In S1, the query information data is stored in a column of memristors of one memristor crossbar array.

More specifically, feature values of query data obtained by performing feature extraction on the query information or the query data per se, i.e., the query information data, is stored in a column of memristors in the memristor crossbar array by the read/write unit under the guidance of the decoder in a form of inversion by bit.

In S2, an XOR operation is performed on each bit of the query information data and each bit of the stored information data, and a result of the operation is stored in at least one column of memristors of the memristor crossbar array other than the column in which the query information data and the stored information data are located.

More specifically, there is at least one stored information data, a column of memristors where the stored information data is located is in at least one column other than the column where the query information data is located, and stored information data in different memristor crossbar arrays is not completely the same.

In S3, an AND operation is performed on each bit of the result of the operation and a result of the AND operation is stored in a memristor unit which is in the same column as that for storing the result of the operation and has no data stored thereon.

In S4, steps S1-S3 are repeated for other memristor crossbar arrays to obtain at least one result of the AND operation, and a data search result is judged according to the result of the AND operation.

If at least one result of the AND operation is logical "1", there is stored information data matched with the query information data in the storage circuit; and if all the results of the AND operation are logical "0", there is no stored information data matched with the query information data in the storage circuit, wherein the number of results of the AND operation which are logical"1" is the number of the stored information data matched with the query information data.

Figure 4:
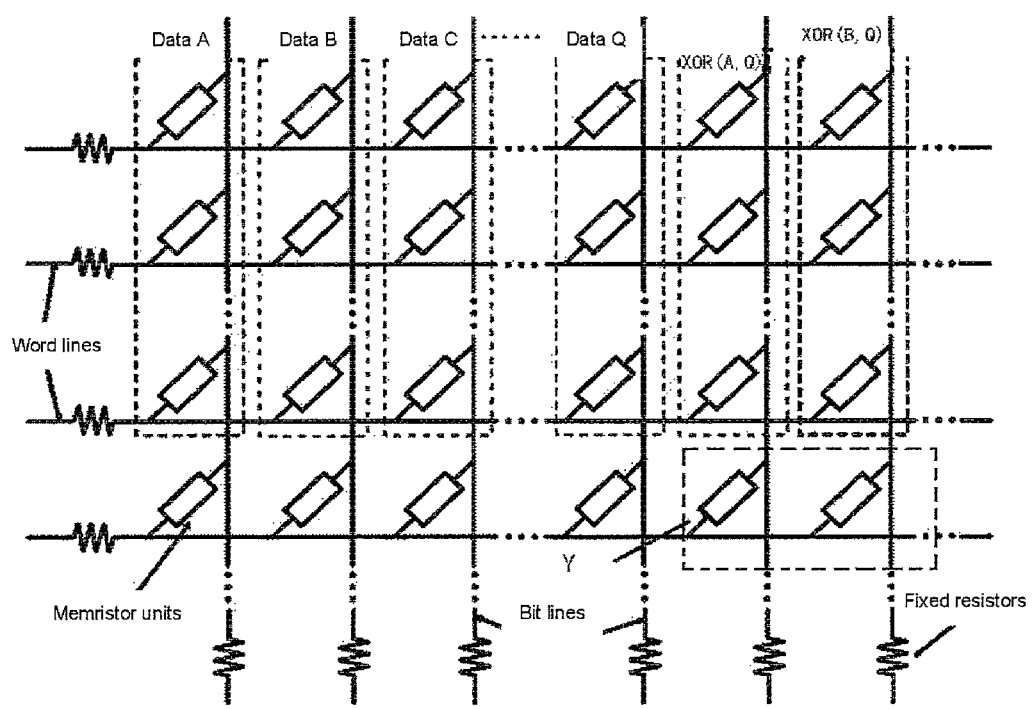
FIG. 4 schematically illustrates a data operation method for a memristor crossbar array according to an embodiment of the present disclosure.

FIG. 4 schematically illustrates a data operation method for a memristor crossbar array according to an embodiment of the present disclosure. As shown in FIG. 4, the memristor crossbar array consists of word lines, bit lines, and memristor units located between the word lines and the bit lines, and there is a fixed resistor connected to each terminal of the word lines and the bit lines for logic calculation. The stored information data A and other stored information data are stored in multiple columns of memristors of one memristor crossbar array. The query information data Q is written by the read/write unit into a column memristors of the memristor crossbar array in which no data is stored in a form of inversion by bit under the guidance of the decoder. When the memristor crossbar array is used for data storage, under the control of the circuit, it can be ensured that there is no case that all storage units in each crossbar array have stored data written therein.

Then, a XOR operation is performed on each bit of the stored information data and the query information data. A result of the operation is stored directly in other multiple columns of memristors of the memristor crossbar array in which no data is stored. Then, an AND operation is performed on data of each bit of the result of the operation and a result obtained by the AND operation is stored in any memristor unit which is in the same column as that for storing the result of the AND operation and has no data stored therein, i.e., a unit Y. The result of the matching step can be detected by reading the state of unit Y. If the query information data Q is completely matched with the stored information data A, each bit of the result of the XOR operation is logical "1", and data stored in the unit Y is also logical "1", which indicates that the current stored data A is completely matched with the query information data Q. If there is a different bit between the query information data Q and the stored information data A, at least one bit of the result of XOR operation is logical "0", and the data stored in the Y unit is also logical "0", which indicates that the current stored information data A is not matched with the query information data Q. At the same time, according to the above steps, the operation is performed sequentially on other stored data in the same memristor crossbar array and each stored data in other memristor crossbar array to obtain data stored in units Y. If there is data of 1 in the units Y, the storage circuit has stored information data matched with the query information data, which indicates that stored information data matched with the query information can be searched in the storage circuit, wherein the number of units Y in logical "1" is the number of stored information data matched with the query information data in the storage circuit; and if all of the data stored in the units Y is logical "0", there is no stored information data matched with the query information data in the storage circuit, which indicates that the stored information data matched with the query information cannot be searched in the storage circuit.

As the matching calculation process is performed in the memristor crossbar array, and the calculated result is stored in the memristor crossbar array together with the stored data information and the query information data, the integration of calculation and storage is realized, thereby greatly reducing the data transmission. At the same time, the storage units in the storage circuit are independent from each other, which can achieve parallel calculation and improve the search efficiency.

Figure 5:
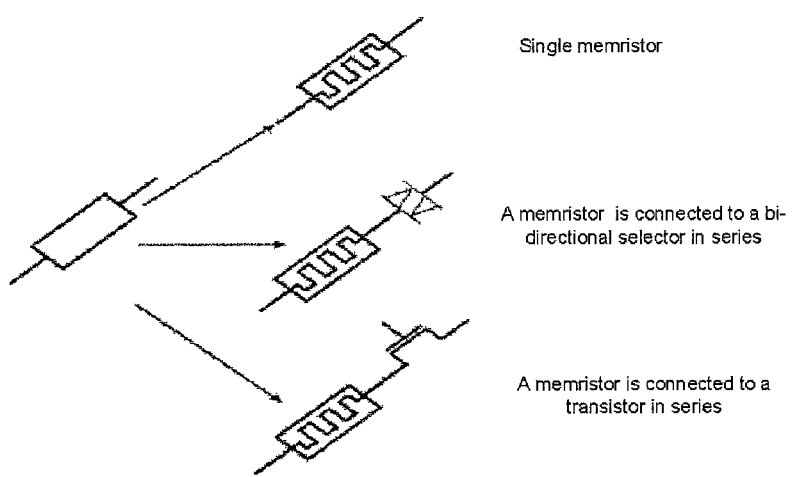
FIG. 5 schematically illustrates a structure of a memristor unit in a memristor crossbar array according to an embodiment of the present disclosure.

FIG. 5 schematically illustrates a structure of a memristor unit in a memristor crossbar array according to an embodiment of the present disclosure. The structure may be 1T1R structure, 1S1R structure, or a 1R structure, wherein T is the transistor, R is the memristor, which may be a new type of storage unit for logical calculation, such as an oxide Resistance Random Access Memory (RRAM), a Conductive-Bridging Random Access Memory (CBRAM) based on metal ion redox, a phase change memory, a Magnetoresistive Random Access Memory (MRAM) etc., and S is the bi-directional selector The purposes, technical solutions and beneficial effects of the present disclosure have been further described in detail with reference to the specific embodiments described above. It should be understood that the above description is merely specific embodiments of the present disclosure and is not intended to limit the present disclosure. Any modification, equivalent substitution, improvement etc. made within the spirit and principle of the present disclosure should be included in the protection scope of the present disclosure.

We claim:

1. A data search system, comprising:
a storage circuit comprising at least one storage unit, wherein the storage unit comprises a memristor crossbar array for storing query information data and stored information data and matching the query information data with the stored information data; and
a control circuit configured to generate a control signal for controlling the storage circuit to complete storing and matching of the query information data.

2. The data search system according to claim 1, wherein the query information data comprises query data or feature values of the query data, and the stored information data comprises stored data or feature values of the stored data.

3. The data search system according to claim 1, wherein the storage units are independent from each other for parallel calculation.

4. The data search system according to claim 1, wherein the memristor crossbar array comprises at least one memristor unit which is a memristor, or a memristor and a bi-directional selector, or a memristor and a transistor.

5. The data search system according to claim 1, wherein the storage unit further comprises:
a decoder configured to generate an address signal and an operation type signal according to the control signal generated by the control circuit, and output the address signal to a multiplexer and the operation type signal to a read/write unit;
the read/write unit configured to generate an operation signal according to the operation type signal and output the operation signal to the multiplexer, wherein the operation signal is a write signal, a read signal and a logical operation signal; output the query information data to the multiplexer; and return a result of an AND operation which is output by the memristor crossbar array to the multiplexer; and
the multiplexer configured to output the operation signal to a corresponding port of the memristor crossbar array according to the address signal, and write the query information data to the memristor crossbar array.

6. The data search system according to claim 2, further comprising a feature extraction circuit configured to extract the feature values of the query data.

7. A data search method for searching at least one memristor crossbar array in a storage circuit for stored information data matched with query information data, comprising:
S1: storing the query information data in a column of memristors in one of the at least one memristor crossbar array;
S2: performing an XOR operation on each bit of the query information data and each bit of the stored information data, and storing a result of the operation in at least one column of the memristor crossbar array other than the column in which the query information data and the stored information data are located;
S3: performing an AND operation on each bit of the result of the XOR operation and storing a result of the AND operation into a memristor unit which is in the same column as that for storing the result of the operation and has no data stored thereon; and
S4: repeating steps S1-S3 for other memristor crossbar arrays to obtain at least one result of the AND operation, and judging a data search result according to the result of the AND operation.

8. The data search method according to claim 7, wherein there is at least one stored information data, a column of memristors where the stored information data is located is in at least one column of memristors other than the column where the query information data is located, and stored information data in different memristor crossbar arrays is not completely the same.

9. The data search method according to claim 7, wherein in step S1, the query information data is stored in the memristor crossbar array in a form of inversion by bit.

10. The data search method according to claim 7, wherein step S4 further comprises:
if at least one result of the AND operation is logical "1", stored information data matched with the query information data can be found by the storage circuit; and if all the results of the AND operation are logical "0", the stored information data matched with the query information data cannot be found by the storage circuit, wherein the number of results of the AND operation which are logical "1" is the number of the stored information data matched with the query information data.

* * * * *